(12) United States Patent
Chuang et al.

(10) Patent No.: US 9,679,817 B2
(45) Date of Patent: Jun. 13, 2017

(54) SEMICONDUCTOR STRUCTURES AND METHODS OF FORMING THE SAME

(71) Applicant: Taiwan Semiconductor Manufacturing Company, Ltd., Hsin-Chu (TW)

(72) Inventors: Harry-Hak-Lay Chuang, Singapore (SG); Po-Nien Chen, Miaoli (TW); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/720,216

(22) Filed: May 22, 2015

(65) Prior Publication Data

US 2015/0255352 A1    Sep. 10, 2015

Related U.S. Application Data

(63) Continuation of application No. 13/795,834, filed on Mar. 12, 2013, now Pat. No. 9,059,022.

(60) Provisional application No. 61/747,106, filed on Dec. 28, 2012.

(51) Int. Cl.
*H01L 21/3205* (2006.01)
*H01L 21/4763* (2006.01)
*H01L 21/8234* (2006.01)
*H01L 27/092* (2006.01)
*H01L 21/8238* (2006.01)

(52) U.S. Cl.
CPC ......... *H01L 21/823462* (2013.01); *H01L 21/82385* (2013.01); *H01L 21/823437* (2013.01); *H01L 21/823857* (2013.01); *H01L 27/092* (2013.01)

(58) Field of Classification Search
CPC ..... H01L 21/823462; H01L 21/823437; H01L 21/82385; H01L 21/823857; H01L 27/092
See application file for complete search history.

(56) References Cited

U.S. PATENT DOCUMENTS

| 6,670,248 B1 | 12/2003 | Ang et al. |
| 6,787,421 B2 | 9/2004 | Gilmer et al. |
| 8,127,266 B1 | 2/2012 | Gupta et al. |

(Continued)

FOREIGN PATENT DOCUMENTS

| CN | 1675759 A | 9/2005 |
| JP | 2008235693 | 10/2008 |

*Primary Examiner* — Su C Kim
(74) *Attorney, Agent, or Firm* — Slater Matsil, LLP

(57) ABSTRACT

A method of forming a semiconductor structure may include: forming a first dielectric layer having a first thickness over a substrate; removing a first portion of the first dielectric layer to expose a second region of the substrate; forming a second dielectric layer having a second thickness over the second region of the substrate; removing a second portion of the first dielectric layer to expose a third region of the substrate; forming a third dielectric layer having a third thickness over the third region of the substrate; and forming a first plurality of gate stacks comprising the first dielectric layer in a first region of the substrate, a second plurality of gate stacks comprising the second dielectric layer in the second region of the substrate, and a third plurality of gate stacks comprising the third dielectric layer in the third region of the substrate.

20 Claims, 4 Drawing Sheets

(56) References Cited

U.S. PATENT DOCUMENTS

| | | | |
|---|---|---|---|
| 2002/0185693 A1* | 12/2002 | Yasuda | H01L 21/28176 |
| | | | 257/392 |
| 2008/0230814 A1 | 9/2008 | Lee et al. | |
| 2008/0258229 A1 | 10/2008 | Ohkawa et al. | |
| 2009/0102010 A1 | 4/2009 | Ema et al. | |
| 2011/0042751 A1 | 2/2011 | Kim et al. | |
| 2012/0056271 A1* | 3/2012 | Akamatsu | H01L 21/76224 |
| | | | 257/392 |
| 2012/0100679 A1* | 4/2012 | Sridhar | H01L 21/823462 |
| | | | 438/232 |
| 2013/0052814 A1* | 2/2013 | Clark | H01L 21/823842 |
| | | | 438/591 |

* cited by examiner

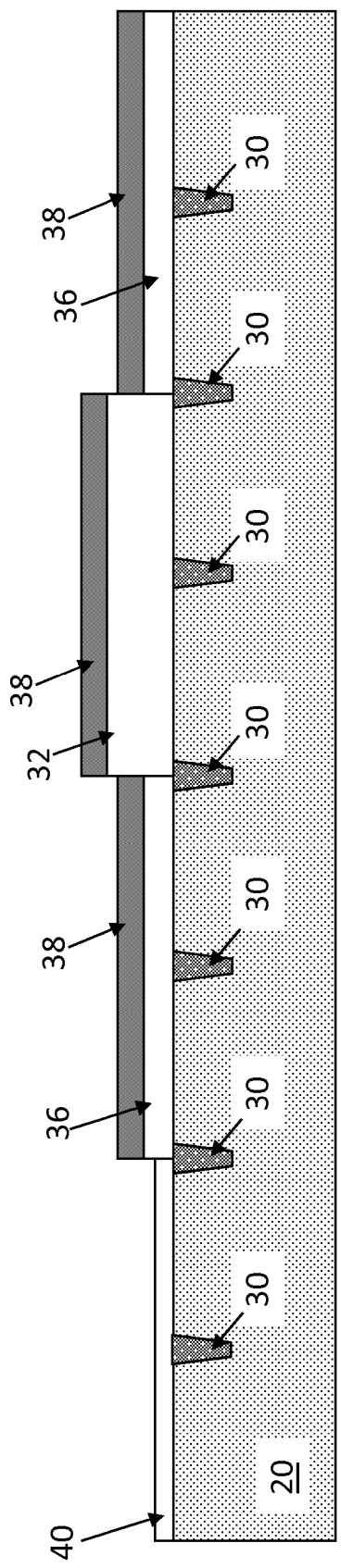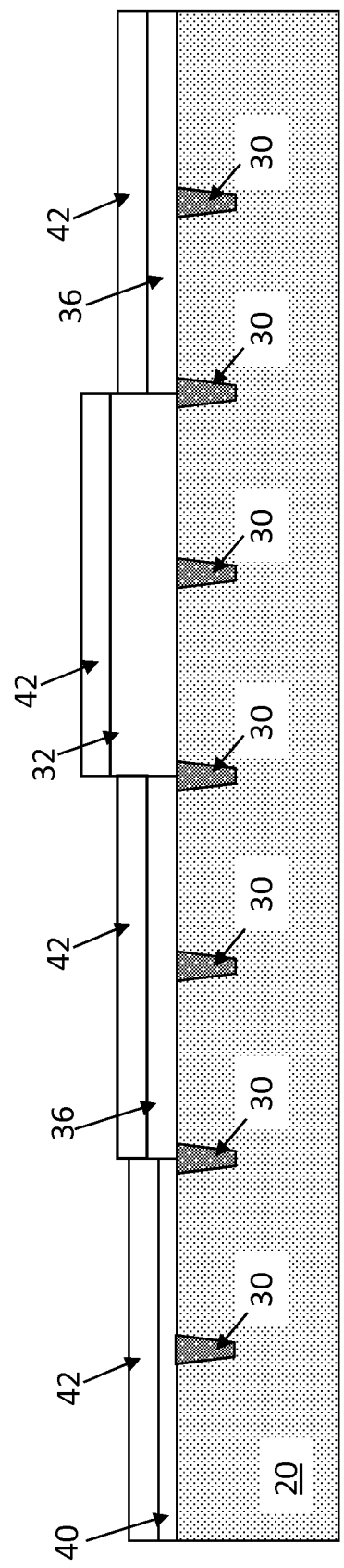

9,679,817 B2

SEMICONDUCTOR STRUCTURES AND METHODS OF FORMING THE SAME

PRIORITY CLAIM AND CROSS-REFERENCE

This application is a continuation of U.S. patent application Ser. No. 13/795,834, filed Mar. 12, 2013, entitled "Semiconductor Structures and Methods of Forming the Same," which application claims the benefit of U.S. Provisional Application Ser. No. 61/747,106, filed on Dec. 28, 2012, entitled "Novel Power Gating Approach on TGO Devices in HKMG CMOS Technology," which applications are hereby incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, by continuously scaling down devices, differences between various performance characteristics of interconnected devices may become exacerbated.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 8 illustrate a process flow and structures according to an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a process for forming semiconductor devices, where at least three of the devices include a dielectric layer in a gate stack with differing thicknesses between the devices. Further, gate lengths of the devices can be biased in various ways. Other embodiments contemplate varying number of devices and/or dielectric layer thicknesses, as well as differing biasing. Although described in a particular order below, method embodiments can be performed in any logical order. Additionally, like reference numbers used in the figures refer to like components.

Figure 1:
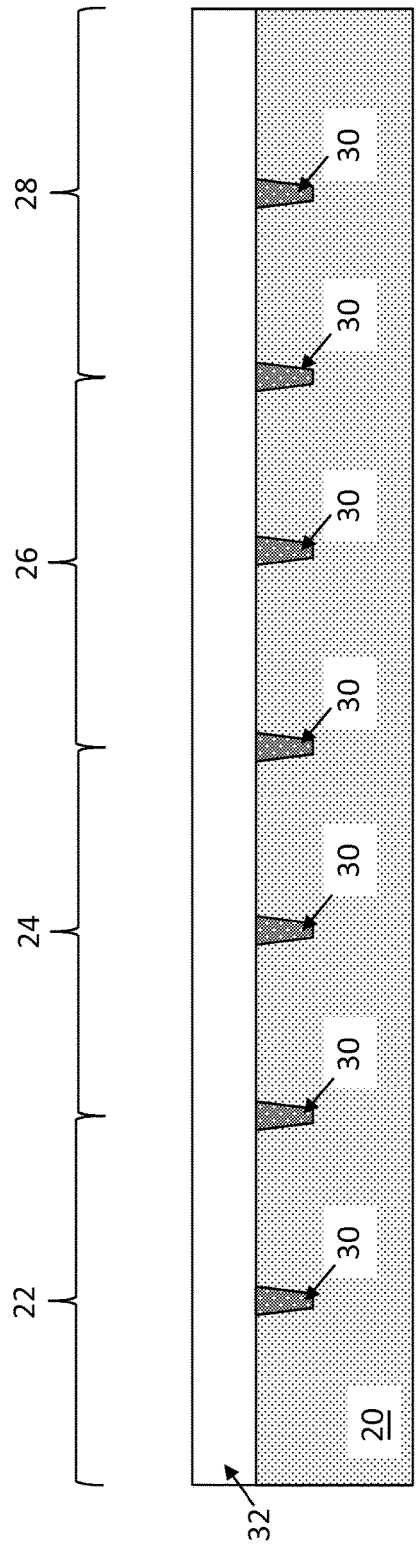

FIGS. 1 through 8 illustrate a process flow and structures according to an embodiment. FIG. 1 illustrates a substrate 20. The substrate 20 may be a semiconductor substrate, which may further be a silicon substrate, a silicon carbon substrate, a silicon germanium substrate, or a substrate formed of other semiconductor materials. The substrate 20 may be a bulk substrate, a semiconductor-on-insulator (SOI) substrate, or other acceptable substrates. The substrate 20 may be lightly doped with a p-type or an n-type impurity. A first region 22, a second region 24, a third region 26, and a fourth region 28 of the substrate 20 are identified in FIG. 1. In an embodiment, the first region 22 is a thin core region, such as containing devices for core circuitry where transistors have a thin gate dielectric; the second region 24 is a thick core region, such as containing devices for core circuitry where transistors have a relatively thicker gate dielectric; the third region 26 is an input/output region, such as containing devices used for inputting and/or outputting signals; and the fourth region 28 is a memory region, such as a SRAM region.

The substrate 20 further comprises isolation regions 30, such as shallow trench isolation regions. The isolation regions 30 may be used to electrically isolate active areas of separate devices in the substrate 20. Some isolation regions 30 can also demark boundaries between adjacent ones of the first, second, third, and fourth regions 22, 24, 26, and 28, respectively. The formation of isolation regions 30 may include etching the substrate 20 to form trenches (not shown), and filling the trenches with a dielectric material to form isolation regions 30. The isolation regions 30 may be formed of silicon oxide deposited by a high density plasma, for example, although other dielectric materials formed according to various techniques may also be used.

A first dielectric layer 32 is formed over the substrate 20. In an embodiment, the first dielectric layer 32 is an oxide layer formed by a thermal oxidation, a high density plasma deposition or the like. In other embodiments, the first dielectric layer 32 can be silicon oxynitride or the like formed by any acceptable technique. The first dielectric layer 32 can have a thickness of between about 25 Å and about 40 Å. Although specific thicknesses are provided herein as examples, different embodiments may have other thicknesses, such as for different technology sizes.

Figure 2:
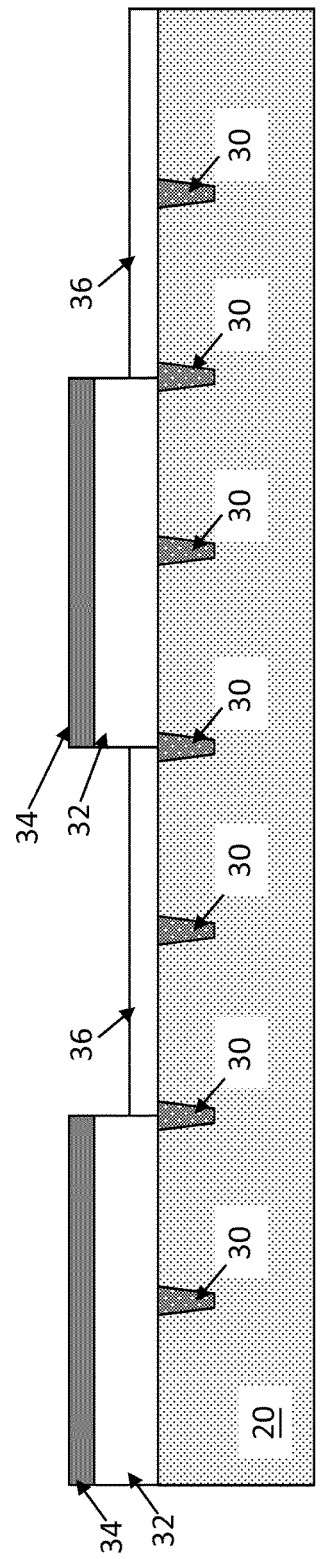

FIG. 2 illustrates the formation of a thick interfacial layer 36 in the second region 24 and the fourth region 28. The first dielectric layer 32 is removed from the second region 24 and the fourth region 28, for example, by patterning a photoresist 34 over the first dielectric layer 32 to cover the first region 22 and the third region 26 while exposing the second region 24 and the fourth region 28 and subsequently etching the exposed portions of the first dielectric layer 32, for example, by an immersion in dilute hydrofluoric acid (dHF). The thick interfacial layer 36 is deposited on the substrate 20 in the second region 24 and the fourth region 28. The thick interfacial layer 36 can comprise silicon oxide, silicon nitride, silicon oxynitride, the like, or a combination thereof, and can be formed using thermal oxidation or chemical oxidation, for example, dipping in ozone de-ionized (DI) water, an appropriate deposition technique, or the like. In an embodiment, the thick interfacial layer 36 has a thickness between about 10 Å and about 20 Å. In an embodiment, the thick interfacial layer 36 has a thickness less than a thickness of the first dielectric layer 32. The photoresist 34 can be subsequently removed using, for example, an appropriate ashing process.

FIG. 3 illustrates the formation of a thin interfacial layer 40 in the first region 22. The first dielectric layer 32 is removed from the first region 22, for example, by patterning a photoresist 38 over the first dielectric layer 32 in the third region 26 and the thick interfacial layer 36 in the second and fourth regions 24 and 28 while exposing the first region 22 and subsequently etching the exposed portions of the first dielectric layer 32, for example, by an immersion in dHF. The thin interfacial layer 40 is deposited on the substrate 20 in the first region 22. The thin interfacial layer 40 can comprise silicon oxide, silicon nitride, silicon oxynitride, the like, or a combination thereof, and can be formed using thermal oxidation or chemical oxidation, for example, dipping in ozone DI water, an appropriate deposition technique, or the like. In an embodiment, the thin interfacial layer 40 has a thickness between about 10 Å and about 15 Å. In an embodiment, the thin interfacial layer 40 has a thickness less than a thickness of the thick interfacial layer 36. In a further embodiment, the thickness of the thin interfacial layer 40 is equal to or greater than about 1 Å, such as between about 1 Å and about 5 Å, less than the thickness of the thick interfacial layer 36. The photoresist 38 can be subsequently removed using, for example, an appropriate ashing process.

FIG. 4 shows a high-k dielectric layer 42 formed on the thin interfacial layer 40, the thick interfacial layer 36, the first dielectric layer 32, and the thick interfacial layer 36 in the first, second, third, and fourth regions 22, 24, 26, and 28, respectively. The high-k dielectric layer 42 can include hafnium oxide ($HfO_2$) or other materials, such as a metal oxide, a nitrided metal oxide, or a silicate of Hf, Al, La, Zr, Ti, Ta, Ba, Sr, Pb, Zn, Y, Gd, Dy, combinations thereof, and multi-layers thereof. Specific examples include $HfO_2$, $HfZrO_x$, $HfAlO_x$, $HfLaO_x$, $HfTiO_x$, $HfTaO_x$, $HfTiTaO_x$, $LaO_3$, $ZrO_2$, $Al_2O_3$, $Ta_2O_5$, $TiO_2$, and combinations thereof. The high-k dielectric layer 42 can be formed using atomic layer deposition (ALD), plasma enhanced chemical vapor deposition (PECVD), low-pressure chemical vapor deposition (LPCVD), metal-organic chemical vapor deposition (MOCVD), plasma enhanced atomic layer deposition (PEALD), physical vapor deposition (PVD), or the like. In an embodiment, the k value of the high-k dielectric layer 42 is greater than about 7.0. In some embodiments, the high-k dielectric layer 42 has a thickness of at least 10 Å, such as between about 10 Å and about 15 Å, although other embodiments contemplate any thickness.

Figure 5:
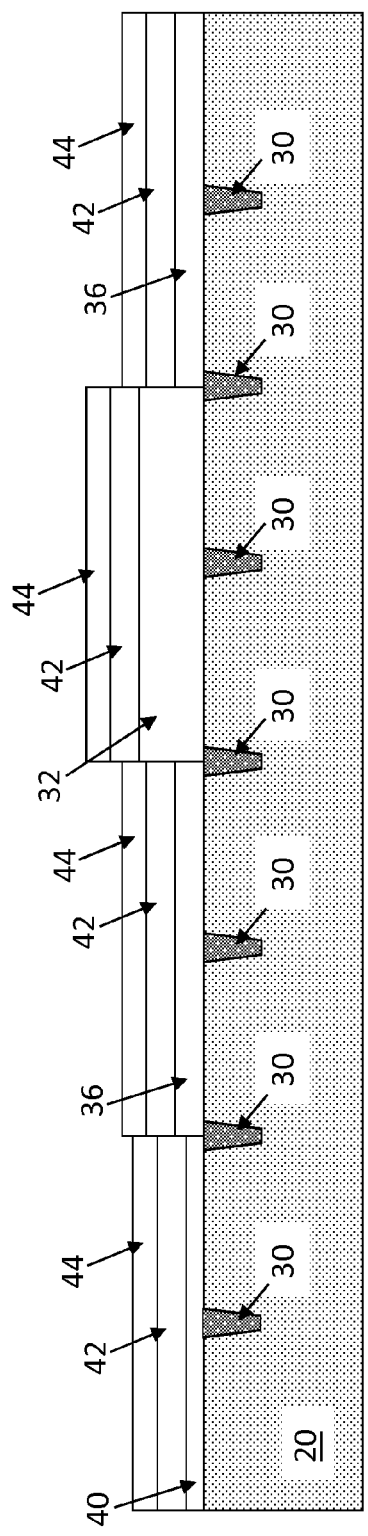

In FIG. 5, a capping layer 44 is formed on the high-k dielectric layer 42 in the first, second, third, and fourth regions 22, 24, 26, and 28, respectively. Example materials for the capping layer 44 include tantalum, titanium, molybdenum, tungsten, ruthenium, platinum, cobalt, nickel, palladium, niobium, and alloys and/or nitrides thereof. Specifically, the capping layer 44 may comprise metal nitrides, such as TiN and TaN. The capping layer 44 may be formed by PVD, ALD, or other applicable chemical vapor deposition (CVD) methods. The capping layer 44 may have a thickness between about 1.5 nm and about 4 nm.

Figure 6:
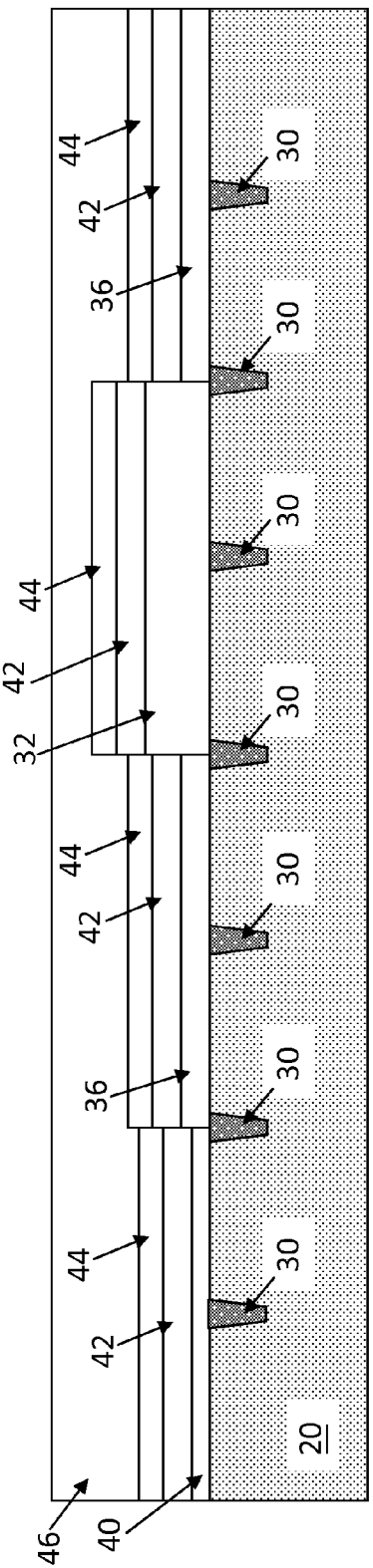

FIG. 6 illustrates the formation of a gate electrode layer 46 on the capping layer 44 in the first, second, third, and fourth regions 22, 24, 26, and 28, respectively. The gate electrode layer 46 comprises a conductive material, such as polysilicon (doped or undoped), a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), the like, or a combination thereof. The gate electrode layer 46 can be deposited using CVD, LPCVD, PVD, or other acceptable deposition techniques. If the deposition of the gate electrode layer 46 is conformal, a planarization technique, such as a chemical mechanical polish (CMP), may be used to planarize the gate electrode layer 46.

Figure 7:
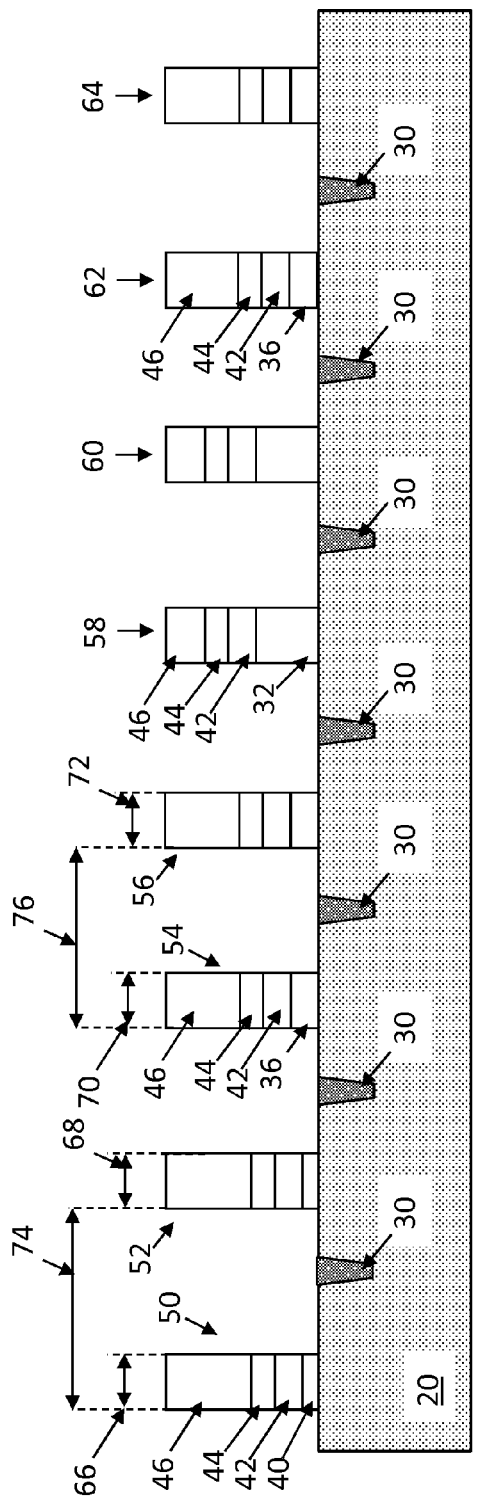

FIG. 7 illustrates the formation of gate stacks 50 and 52 in the first region 22, gate stacks 54 and 56 in the second region 24, gate stacks 58 and 60 in the third region 26, and gate stacks 62 and 64 in the fourth region 28. Gate stacks 50 and 52 comprise the thin interfacial layer 40, the high-k dielectric layer 42, the capping layer 44, and the gate electrode layer 46. Gate stacks 54, 56, 62, and 64 comprise the thick interfacial layer 36, the high-k dielectric layer 42, the capping layer 44, and the gate electrode layer 46. Gate stacks 58 and 60 comprise the first dielectric layer 32, the high-k dielectric layer 42, the capping layer 44, and the gate electrode layer 46. The gate stacks 50, 52, 54, 56, 58, 60, 62, and 64 can be formed by depositing a mask layer over the gate electrode layer 46 and depositing a photoresist over the mask layer. The photoresist can be patterned using photolithography, and a subsequent etch can transfer the pattern of the photoresist to the mask layer. Using the mask layer, the various layers of the gate stacks 50, 52, 54, 56, 58, 60, 62, and 64 can be etched to form the gate stacks 50, 52, 54, 56, 58, 60, 62, and 64. The various masking and/or etching steps can be performed simultaneously for all of the gate stacks 50, 52, 54, 56, 58, 60, 62, and 64, or some masking and/or etching steps can be performed for gate stacks within only one or more region while similar masking and/or etching steps are performed separately for gate stacks within another region.

FIG. 7 further depicts example gate lengths 66, 68, 70, and 72 and pitches 74 and 76. In FIG. 7, the gate lengths are distances between opposing sidewalls of a gate stack. Gate lengths 66, 68, 70, and 72 are shown for gate stacks 50, 52, 54, and 56, respectively. In FIG. 7, the pitches are distances between corresponding sidewalls of adjacent gate stacks. Pitch 74 is shown between gate stacks 50 and 52, and pitch 76 is shown between gate stacks 54 and 56. The other gate stacks and other regions also have pitches and gate lengths that are not explicitly depicted.

Various gate lengths can be modified or biased for a particular application. For example, the gate lengths 70 and 72 of gate stacks 54 and 56, respectively, can be a critical dimension, and the gate lengths 66 and 68 of gate stacks 50 and 52 can vary from that critical dimension, such as by about +/−5 nm. In that example, the gate lengths of gate stacks 58, 60, 62, and 64 can also be the critical dimension, and hence, the gate stacks 50 and 52 in the first region 22 can have a gate length bias with respect to the critical dimension used in the gate stacks in the second, third, and fourth regions 24, 26, and 28, respectively. Further, the gate stacks 50 and 52 can have differing gate lengths 66 and 68, e.g., can be biased differently. In an embodiment, the gate lengths of gate stacks 54, 56, 58, 60, 62, and 64 are a critical dimension, such as about 30 nm, and the gate lengths 66 and 68 of gate stacks 50 and 52 are about 2 to about 3 nm greater than the critical dimension, such as about 32 nm to about 33 nm. In other embodiments, the gate stacks 54, 56, 58, 60, 62, and 64 have gate lengths that vary from each other, e.g., some of the gate stacks 54, 56, 58, 60, 62, and 64 can also be biased.

In some embodiments, pitches between neighboring gate stacks within a region are equal to pitches between neighboring gate stacks within other regions. For example, pitch 74 between gate stacks 50 and 52, pitch 76 between gate stacks 54 and 56, pitch between gate stacks 58 and 60, and pitch between gate stacks 62 and 64 are equal. In an embodiment, these pitches are between about 90 nm and about 150 nm, such as about 130 nm, although various other pitches can be used, such as with differing technology nodes.

In other embodiments, the pitches can vary between regions and/or among various devices within a given region.

Figure 8:
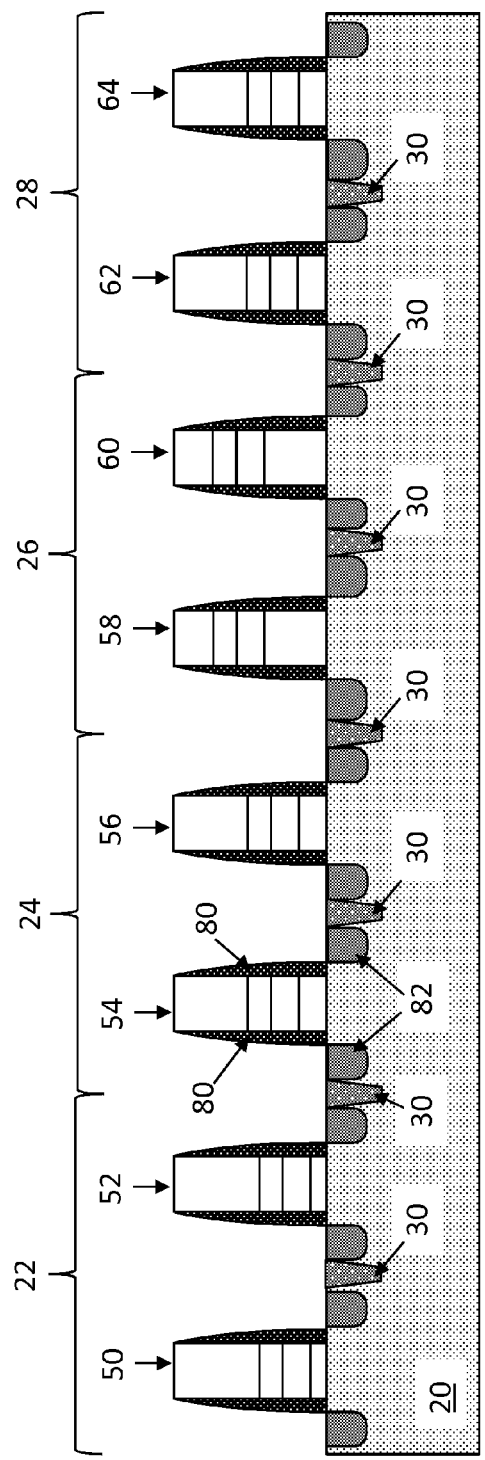

FIG. 8 illustrates the formation of spacers 80 and source/drain regions 82 for various transistors comprising respective ones of the gate stacks 50, 52, 54, 56, 58, 60, 62, and 64. The spacers 80 and source/drain regions 82 are depicted for each gate stack, but not all are specifically indicated with a reference numeral so as not to obscure the depiction. The spacers 80 are formed on the sidewalls of the gate stacks 50, 52, 54, 56, 58, 60, 62, and 64, such as by blanket depositing a spacer layer and subsequently anisotropically etching the spacer layer to leave the spacers 80. The spacers layer can comprise silicon nitride, an oxynitride, silicon carbide, silicon oxynitride, an oxide, and the like, and can be deposited by methods such as CVD, PECVD, sputter, and other suitable techniques.

Source/drain regions 82 are formed in the substrate 20 on opposing sides of the gate stacks 50, 52, 54, 56, 58, 60, 62, and 64. In an embodiment in which a transistor to be formed is a p-type transistor, such as a pFET, the source/drain regions 82 can be formed by implanting appropriate p-type dopants such as boron, gallium, indium, or the like. Similarly, in an embodiment in which a transistor to be formed is an n-type transistor, such as an nFET, the source/drain regions 82 can be formed by implanting appropriate n-type dopants such as phosphorus, arsenic, or the like. Many other processes, steps, or the like may be used to form the source/drain regions 82.

Although not explicitly shown, a person having ordinary skill in the art will readily understand that further processing steps may be performed on the structure in FIG. 8. For example, an etch stop layer may be formed over and adjoining the transistors comprising the gate stacks 50, 52, 54, 56, 58, 60, 62, and 64, and an interlayer dielectric (ILD) can be formed over the etch stop layer. Contacts to respective source/drain regions 82 can be formed in the ILD. Another etch stop layer can be formed over the ILD, and inter-metal dielectrics (IMDs) and their corresponding metallizations may be formed over the etch stop layer.

Embodiments may have advantages. For example, various devices in some embodiments can be designed to have better performance characteristics for a given application. By allowing differing dielectric thicknesses and by allowing for various gate biasing, a device can be more specifically designed to allow an application to perform better. One example is that a product level Iddq versus Fmax performance may be optimized.

An embodiment is a structure. The structure includes three devices in respective three regions of a substrate. The first device comprises a first gate stack, and the first gate stack comprises a first dielectric layer. The second device comprises a second gate stack, and the second gate stack comprises a second dielectric layer. The third device comprises a third gate stack, and the third gate stack comprises a third dielectric layer. A thickness of the third dielectric layer is less than a thickness of the second dielectric layer, and the thickness of the second dielectric layer is less than a thickness of the first dielectric layer. A gate length of the third gate stack differs in amount from a gate length of the first gate stack and a gate length of the second gate stack.

Another embodiment is a structure. The structure comprises first, second, and third regions of a substrate. The first region comprises a first device and a second device. The second region comprises a third device and a fourth device. The third region comprises a fifth device and a sixth device. The first, second, third, fourth, fifth, and sixth devices comprise a first, second, third, fourth, fifth, and sixth gate stack, respectively. The first gate stack and the second gate stack each comprise a first dielectric layer having a first thickness. The third gate stack and the fourth gate stack each comprise a second dielectric layer having a second thickness. The fifth gate stack and the sixth gate stack each comprise a third dielectric layer having a third thickness. The third thickness is greater than the second thickness, and the second thickness is greater than the first thickness. The first, second, third, fourth, fifth, and sixth gate stacks have a respective length between opposing sidewalls of the first, second, third, fourth, fifth, and sixth gate stacks, respectively. Each of the first length and the second length is different in dimension from each of the third length, the fourth length, the fifth length, and the sixth length. A first pitch is between the first gate stack and the second gate stack. A second pitch is between the third gate stack and the fourth gate stack. A third pitch is between the fifth gate stack and the sixth gate stack.

A further embodiment is a method. The method comprises forming a first dielectric layer in a first region of a substrate, forming a second dielectric layer in a second region of the substrate, forming a third dielectric layer in a third region of the substrate, forming a first gate stack comprising the first dielectric layer, forming a second gate stack comprising the second dielectric layer, and forming a third gate stack comprising the third dielectric layer. The first dielectric layer has a first thickness; the second dielectric layer has a second thickness; and the third dielectric layer has a third thickness. The first thickness is greater than the second thickness, and the second thickness is greater than third thickness. The first gate stack has a first gate length; the second gate stack has a second gate length; and the third gate stack has a third gate length. The third gate length is greater or less than the first gate length and the second gate length.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
    forming a first dielectric layer over a substrate, the substrate comprising a first region, a second region, and a third region separated from each other by isolation regions, the first dielectric layer having a first thickness;
    removing a first portion of the first dielectric layer to expose the second region of the substrate, wherein removing the first portion of the first dielectric layer to expose the second region of the substrate comprises:
        patterning a first photoresist over the first dielectric layer to cover the first region and the third region of the substrate while exposing the first dielectric layer over the second region of the substrate; and etching the first dielectric layer over the second region of the substrate using the first photoresist as an etching mask;

forming a second dielectric layer over the second region of the substrate, the second dielectric layer having a second thickness less than the first thickness, wherein forming the second dielectric layer comprises using the first photoresist as a deposition mask;

after forming the second dielectric layer, removing a second portion of the first dielectric layer to expose the third region of the substrate;

forming a third dielectric layer over the third region of the substrate, the third dielectric layer having a third thickness less than the second thickness; and forming a first plurality of gate stacks comprising the first dielectric layer in the first region of the substrate, a second plurality of gate stacks comprising the second dielectric layer in the second region of the substrate, and a third plurality of gate stacks comprising the third dielectric layer in the third region of the substrate.

2. The method of claim 1, wherein the forming the first dielectric layer comprises a thermal oxidation process, a deposition process, or a combination thereof.

3. The method of claim 1, wherein the first dielectric layer has a thickness in a range from about 25 Angstroms to about 40 Angstroms.

4. The method of claim 1, wherein the forming the second dielectric layer comprises a deposition process, an oxidation process, a dipping process, or a combination thereof.

5. The method of claim 4, wherein the dipping process comprises dipping in ozone de-ionized water.

6. The method of claim 1, wherein the second dielectric layer has a thickness in a range from about 10 Angstroms to about 20 Angstroms.

7. The method of claim 1, wherein the removing the second portion of the first dielectric layer to expose the third region of the substrate comprises:

patterning a second photoresist over the second dielectric layer in the second region of the substrate and over the first dielectric layer in the first region of the substrate while exposing the first dielectric layer over the third region of the substrate; and etching the first dielectric layer over the third region of the substrate using the second photoresist as an etching mask.

8. The method of claim 7, wherein forming the third dielectric layer comprises using the second photoresist as a deposition mask.

9. The method of claim 1, wherein the third dielectric layer has a thickness in a range from about 10 Angstroms to about 15 Angstroms.

10. The method of claim 1, wherein the third dielectric layer has a thickness in a range from about 1 Angstrom to about 5 Angstroms.

11. The method of claim 1, wherein a pitch of the first plurality of gate stacks is different from a pitch of the second plurality of gate stacks and a pitch of the third plurality of gate stacks.

12. The method of claim 1, wherein a gate length of at least one gate stack of the third plurality of gate stacks is greater than a gate length of at least one gate stack of the second plurality of gate stacks.

13. A method, comprising:

forming a first dielectric layer over a first region and a third region of a substrate;

forming a second dielectric layer over a second region and a fourth region of the substrate, the second region and fourth region being located at opposite sides of the first region of the substrate, and the third region being located at a side of the second region facing away from the first region;

after forming the second dielectric layer, patterning the first dielectric layer to expose the third region of the substrate;

after patterning the first dielectric layer, forming a third dielectric layer over the third region of the substrate, wherein the first dielectric layer has a first thickness, wherein the second dielectric layer has a second thickness less than the first thickness, and wherein the third dielectric layer has a third thickness less than the second thickness;

forming a high-k dielectric layer over the first dielectric layer, the second dielectric layer, and the third dielectric layer;

forming a gate electrode layer over the high-k dielectric layer; and patterning the gate electrode layer, the high-k dielectric layer, the first dielectric layer, the second dielectric layer, and the third dielectric layer to form a first gate stack comprising the first dielectric layer over the first region of the substrate, a second gate stack comprising the second dielectric layer over the second region of the substrate, a third gate stack comprising the third dielectric layer over the third region of the substrate, and a fourth gate stack comprising the second dielectric layer over the fourth region of the substrate, wherein a gate length of the third gate stack is greater than a gate length of the second gate stack.

14. The method of claim 13, wherein the patterning the gate electrode layer, the high-k dielectric layer, the first dielectric layer, the second dielectric layer, and the third dielectric layer comprises:

forming a patterned mask layer over the gate electrode layer; and transferring a pattern of the patterned mask layer to the gate electrode layer, the high-k dielectric layer, the first dielectric layer, the second dielectric layer, and the third dielectric layer.

15. The method of claim 13, wherein the high-k dielectric layer has a dielectric constant greater than about 7.0.

16. The method of claim 13, wherein the high-k dielectric layer has a thickness in a range from about 10 Angstroms to about 15 Angstroms.

17. A method, comprising:

forming a first plurality of gate stacks in a first region of a substrate, each of the first plurality of gate stacks comprising a first dielectric layer closest to the substrate, the first dielectric layer having a first thickness;

forming a second plurality of gate stacks in a second region of the substrate, each of the second plurality of gate stacks comprising a second dielectric layer closest to the substrate, the second dielectric layer having a second thickness less than the first thickness; and forming a third plurality of gate stacks in a third region of the substrate, each of the third plurality of gate stacks comprising a third dielectric layer closest to the substrate, the third dielectric layer having a third thickness less than the second thickness, at least one gate stack of the third plurality of gate stacks having a gate length greater than a gate length of at least one gate stack of the second plurality of gate stacks.

18. The method of claim 17, wherein a pitch of at least one of the first plurality of gate stacks, the second plurality of gate stacks, or the third plurality of gate stacks is in a range from about 90 nanometers to about 150 nanometers.

19. The method of claim 17, wherein gate stacks of the third plurality of gate stacks have differing gate lengths.

20. The method of claim 17, further comprising:
   implanting first source/drain regions in the first region of the substrate between adjacent ones of the first plurality of gate stacks;
   implanting second source/drain regions in the second region of the substrate between adjacent ones of the second plurality of gate stacks; and
   implanting third source/drain regions in the third region of the substrate between adjacent ones of the third plurality of gate stacks.

\* \* \* \* \*